US012177981B2

(12) United States Patent
Sano

(10) Patent No.: US 12,177,981 B2
(45) Date of Patent: Dec. 24, 2024

(54) ELECTRONIC DEVICE INCLUDING LINES PROVIDED ON ELASTIC BASE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 176 days.

(21) Appl. No.: 17/972,693

(22) Filed: Oct. 25, 2022

(65) Prior Publication Data

US 2023/0139469 A1    May 4, 2023

(30) Foreign Application Priority Data

Nov. 1, 2021  (JP) ................................. 2021-178748

(51) Int. Cl.
*H05K 1/18*      (2006.01)
*H05K 1/02*      (2006.01)

(52) U.S. Cl.
CPC ........... *H05K 1/181* (2013.01); *H05K 1/0277* (2013.01); *H05K 2201/09227* (2013.01); *H05K 2201/10106* (2013.01); *H05K 2201/10151* (2013.01)

(58) Field of Classification Search
CPC ................ H05K 1/181; H05K 1/0277; H05K 2201/09227; H05K 2201/10106; H05K 2201/10151
USPC ....................................................... 174/250
See application file for complete search history.

(56) References Cited

U.S. PATENT DOCUMENTS

| 8,207,473 B2* | 6/2012 | Axisa .................... B32B 37/185 |
| | | 219/121.72 |
| 9,391,286 B1* | 7/2016 | Kwon .................. H10K 50/858 |
| 10,026,721 B2* | 7/2018 | Kim ...................... H01L 25/167 |
| 10,964,769 B2* | 3/2021 | Park ..................... H10K 59/124 |
| 2015/0282294 A1 | 10/2015 | Wakuda et al. |
| 2015/0282296 A1 | 10/2015 | Ogura et al. |
| 2015/0382457 A1* | 12/2015 | Tomita ................. H05K 1/0283 |
| | | 174/254 |
| 2017/0181276 A1* | 6/2017 | Sawada ................... B32B 27/38 |
| 2017/0181277 A1* | 6/2017 | Tomita ................... H05K 1/038 |
| 2018/0046221 A1* | 2/2018 | Choi ...................... H05B 33/22 |

FOREIGN PATENT DOCUMENTS

JP     2017-113088 A    6/2017

* cited by examiner

*Primary Examiner* — Timothy J Thompson
*Assistant Examiner* — Michael F McAllister
(74) *Attorney, Agent, or Firm* — Michael Best & Friedrich LLP

(57) ABSTRACT

An electronic device includes an insulating base having elasticity, a plurality of lines provided on the insulating base, and a plurality of electric elements connected to the lines. The insulating base includes island-shaped portions in which the electric elements are located, and band-like portions in which the lines are provided and which connect the adjacent island-shaped portions. The band-like portions include a curved portion which meanders, and a straight line portion which connects the curved portion and the island-shaped portion. The curved portion includes a first curved portion, a second curved portion and a third curved portion. A width of the second curved portion is less than a width of the third curved portion.

8 Claims, 7 Drawing Sheets

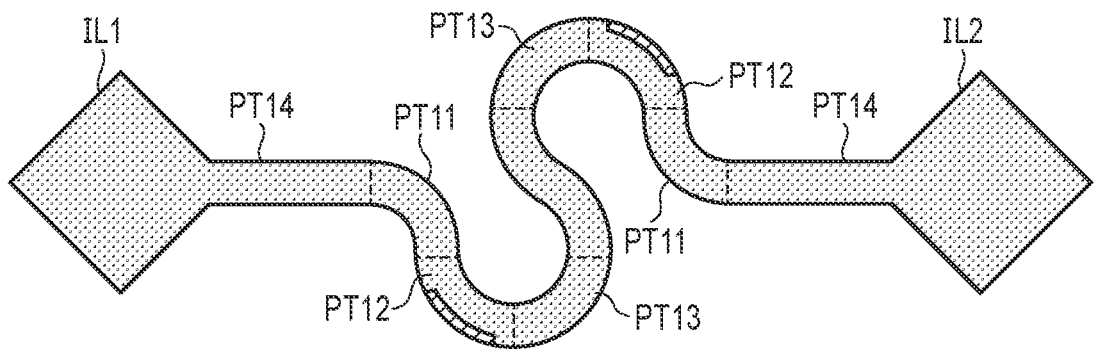
F I G. 7
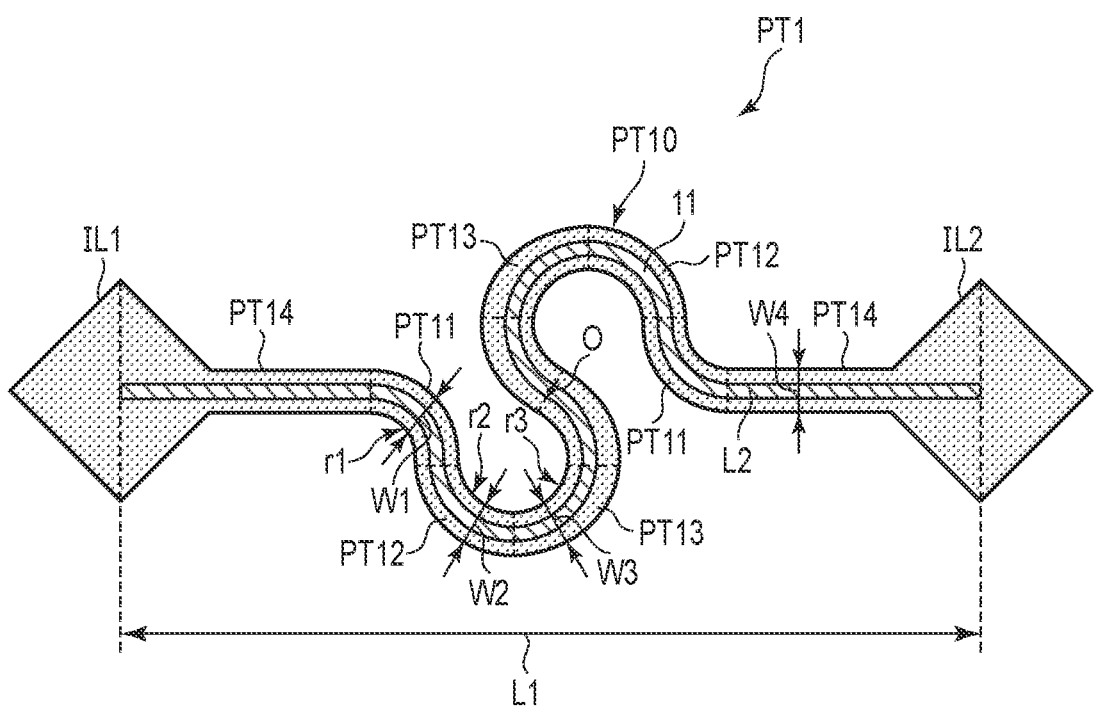
F I G. 8

| | | Radius of curvature r2 [μm] | |
|---|---|---|---|
| | | 15 | 45 |
| Line width W2 [μm] | 10 | Sample 2 | |
| | 30 | Sample 1 | Sample 3 |

Compression rate 10%

| | | Radius of curvature r2 [μm] | |
|---|---|---|---|
| | | 15 | 45 |
| Line width W2 [μm] | 10 | Line strain 5% | |
| | 30 | Line strain 20% | Line strain 10% |

FIG. 11

ELECTRONIC DEVICE INCLUDING LINES PROVIDED ON ELASTIC BASE

CROSS-REFERENCE TO RELATED APPLICATIONS

This application is based upon and claims the benefit of priority from Japanese Patent Application No. 2021-178748, filed Nov. 1, 2021, the entire contents of which are incorporated herein by reference.

FIELD

Embodiments described herein relate generally to an electronic device.

BACKGROUND

In recent years, the use of flexible substrates having flexibility and elasticity has been considered in various fields. For example, the following utilization form has been considered. A flexible substrate in which electric elements are arrayed in matrix is attached to a curved surface of the housing of an electronic device, a human body, etc. As the electric elements, for example, various types of sensors such as a touch sensor and a temperature sensor and display elements could be applied.

In the flexible substrate, measures should be taken to prevent damage to lines because of stress by flection or expansion and contraction. As the measures, for example, the following structures have been suggested. An opening having a honeycomb shape may be provided in a base which supports lines, or a shape (meander shape) in which lines meander may be adopted.

BRIEF DESCRIPTION OF THE DRAWINGS

FIG. 7 is a diagram for explaining how a compressive stress is applied when the compressive stress is applied to the structure shown in FIG. 6.

FIG. 8 is a diagram for explaining another example of the structure applied to the first portion.

FIG. 11 is a diagram showing the result of the compressive test of each sample.

DETAILED DESCRIPTION

Figure 1:
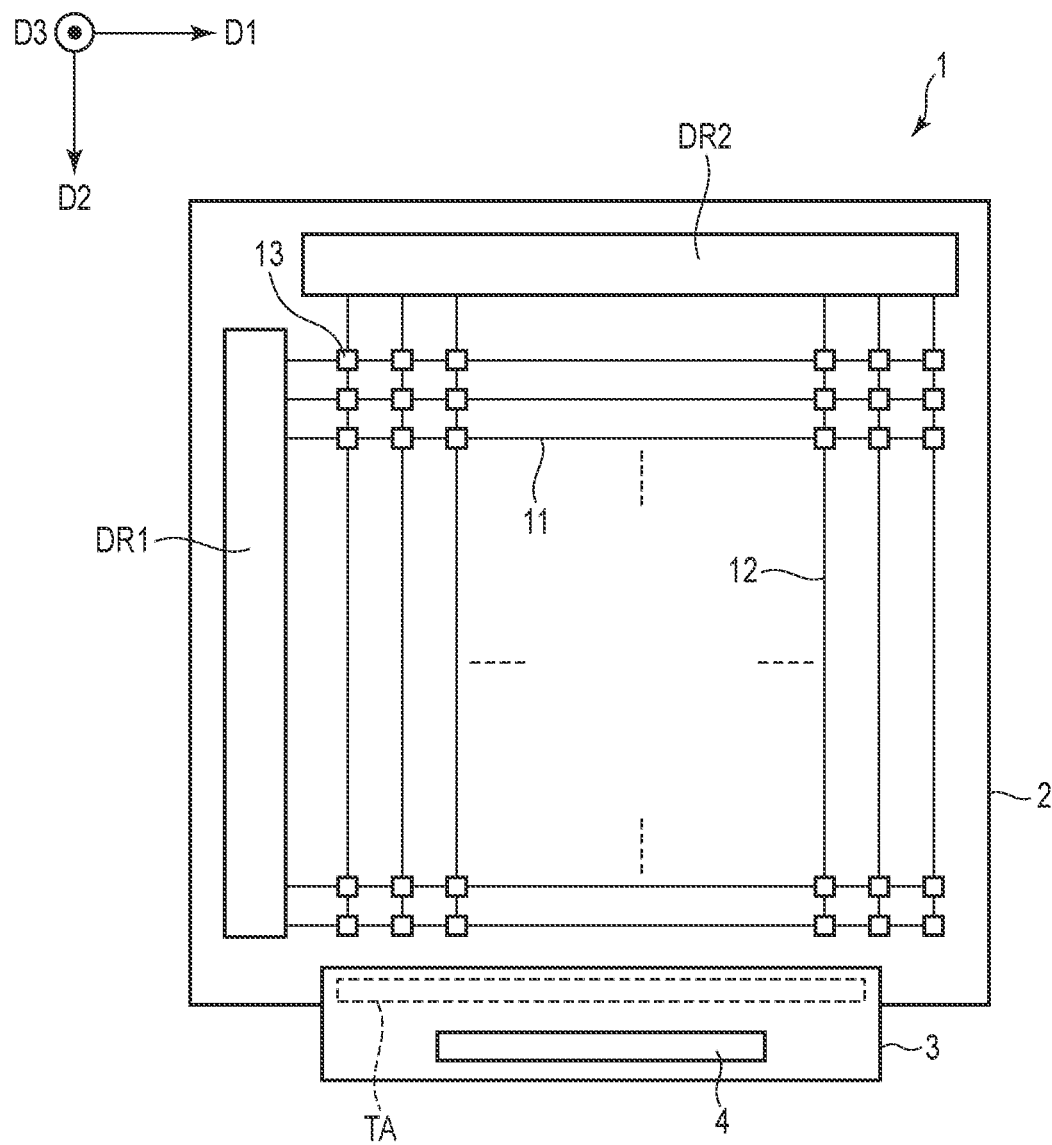
FIG. 1 is a schematic plan view of an electronic device according to an embodiment.

In general, according to one embodiment, an electronic device comprises an insulating base having elasticity, a plurality of lines provided on the insulating base, and a plurality of electric elements connected to the lines. The insulating base comprises a plurality of island-shaped portions in which the electric elements are located, and a plurality of band-like portions in which the lines are provided and which connect the adjacent island-shaped portions. Each of the band-like portions includes a curved portion which meanders, and a straight line portion which connects the curved portion and the island-shaped portion. The curved portion includes a first curved portion, a second curved portion and a third curved portion. The first curved portion is connected to the straight line portion and is curved so as to move away from the straight line portion in both a first direction in which the straight line portion extends and a second direction orthogonal to the first direction. The second curved portion is connected to the first curved portion and is curved so as to move away from the straight line portion in both of the directions. The third curved portion is connected to the second curved portion and is curved so as to move away from the straight line portion in the first direction and so as to approach the straight line portion in the second direction. A width of the second curved portion is less than a width of the third curved portion.

According to another embodiment, an electronic device comprises an insulating base having elasticity, a plurality of lines provided on the insulating base, and a plurality of electric elements connected to the lines. The insulating base comprises a plurality of island-shaped portions in which the electric elements are located, and a plurality of band-like portions in which the lines are located and which connect the adjacent island-shaped portions. Each of the band-like portions includes a curved portion which meanders, and a straight line portion which connects the curved portion and the island-shaped portion. The curved portion includes a first curved portion, a second curved portion and a third curved portion. The first curved portion is connected to the straight line portion and is curved so as to move away from the straight line portion in both a first direction in which the straight line portion extends and a second direction orthogonal to the first direction. The second curved portion is connected to the first curved portion and is curved so as to move away from the straight line portion in both of the directions. The third curved portion is connected to the second curved portion and is curved so as to move away from the straight line portion in the first direction and so as to approach the straight line portion in the second direction. A radius of curvature of the second curved portion is greater than a radius of curvature of the third curved portion.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a schematic plan view of an electronic device 1 according to an embodiment. In the present embodiment, a first direction D1, a second direction D2 and a third direction D3 are defined as shown in the figures. The first direction D1 and the second direction D2 are parallel to the main surface of the electronic device 1 and intersect each other. The third direction D3 is perpendicular to the first direction D1 and the second direction D2 and is equivalent to the thickness direction of the electronic device 1. The first direction D1 and the second direction D2 intersect at right angles in the present embodiment. However, they may intersect at an angle other than a right angle. In this specification, the direction of the arrow indicating the third direction D3 is referred to as a direction to an upper side. The opposite direction of the arrow is referred to as a direction to a lower side. It is assumed that an observation position for observing the electronic device 1 is on the tip side of the arrow of the third direction D3. When the D1-D2 plane defined by the first direction D1 and the second direction D2 is viewed at the observation position, the appearance is referred to as a plan view.

The electronic device 1 comprises a flexible substrate 2, a circuit board 3 and a controller 4. The circuit board 3 is, for example, a flexible printed circuit board, and is electrically connected to each terminal in the terminal area TA of the flexible substrate 2. The controller 4 is mounted on the circuit board 3. However, the controller 4 may be mounted on the flexible substrate 2.

The flexible substrate 2 has flexibility and elasticity. The specific structural example to realize elasticity is explained later.

The flexible substrate 2 comprises a plurality of scanning lines 11, a plurality of signal lines 12, a plurality of electric elements 13, a scanning line driver DR1, a signal line driver DR2, etc. The scanning lines 11 extend in the first direction D1 and are arranged in the second direction D2. The scanning lines 11 are connected to the scanning line driver DR1. The signal lines 12 extend in the second direction D2 and are arranged in the first direction D1. The signal lines 12 are connected to the signal line driver DR2. The electric elements 13 are located in the respective intersections of the scanning lines 11 and the signal lines 12, and are electrically connected to the scanning lines 11 and the signal lines 12. The details of the function of the electric elements 13 are described later.

Figure 2:
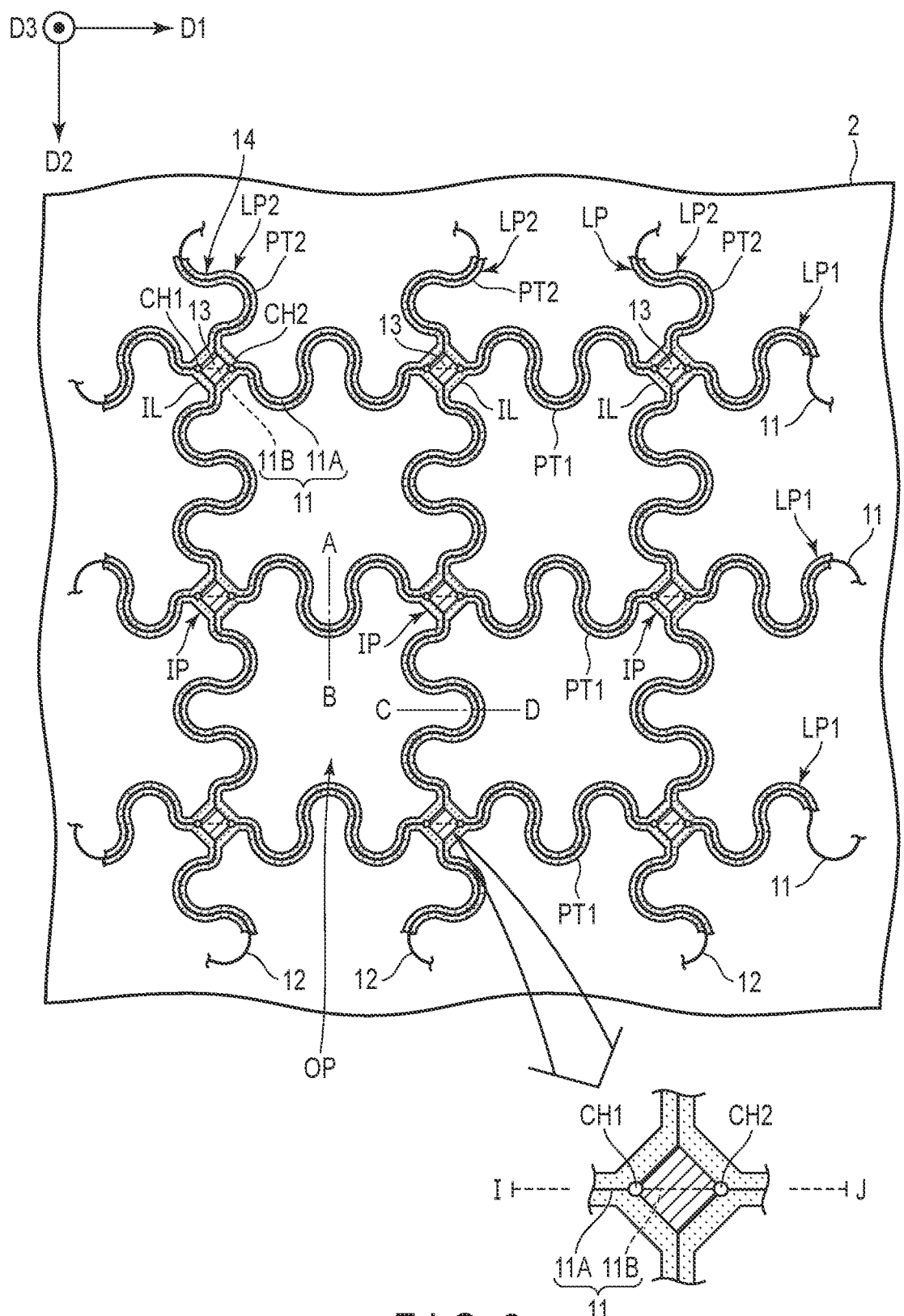
FIG. 2 is a plan view in which part of the flexible substrate shown in FIG. 1 is enlarged.

FIG. 2 is a plan view in which part of the flexible substrate 2 shown in FIG. 1 is enlarged. In addition to the above elements, the flexible substrate 2 comprises an insulating base 14 which supports the scanning lines 11 and the signal lines 12.

The insulating base 14 is formed into a mesh shape. As seen in plan view, the insulating base 14 comprises a plurality of first portions (line portions) PT1 extending in the first direction D1 and arranged in the second direction D2, a plurality of second portions (line portions) PT2 extending in the second direction D2 and arranged in the first direction D1, and a plurality of island-shaped portions IL provided in the intersections of the first portions PT1 and the second portions PT2. As seen in plan view, each of the first portions PT1 and the second portions PT2 is formed in a wavelike fashion. The island-shaped portions IL are connected to the first portions PT1 and the second portions PT2. The insulating base 14 has flexibility and elasticity, and can be formed of, for example, polyimide. However, the insulating base 14 is not limited to this example.

The scanning lines 11 are provided on the first portions PT1 of the insulating base 14 in a wavelike fashion. The signal lines 12 are provided on the second portions PT2 of the insulating base 14 in a wavelike fashion. The scanning lines 11 and the signal lines 12 are examples of the lines provided in the flexible substrate 2 (provided in the electronic device 1). The scanning lines 11 and the signal lines 12 can be formed of, for example, a metal material or a transparent conductive material, and may have either a single-layer structure or a multilayer structure. In addition to the scanning lines 11 and the signal lines 12, the flexible substrate 2 may comprise other types of lines such as power lines for supplying electricity to the electric elements 13.

Each scanning line 11 comprises a first portion 11A shown by a solid line and a second portion 11B shown by a broken line. The second portion 11B overlaps the electric element 13. The first portion 11A and the second portion 11B are provided in different layers and are electrically connected to each other through contact holes CH1 and CH2.

The scanning lines 11 supply a scanning signal to the electric elements 13. For example, when each electric element 13 is an element which outputs a signal such as a sensor, an output signal from the electric element 13 is supplied to the signal line 12. For example, when each electric element 13 is an element which operates based on the input signal such as a light emitting element or an actuator, a drive signal is supplied to the signal line 12.

The electric elements 13 are provided on the island-shaped portions IL. Each electric element 13 is smaller than each island-shaped portion IL. In FIG. 2, each island-shaped portion IL protrudes from the edge of the electric element 13. For example, each electric element 13 is a sensor, a semiconductor element or an actuator. To the sensor, for example, an optical sensor which receives visible light or near-infrared light, a temperature sensor, a pressure sensor or a touch sensor can be applied. To the semiconductor element, for example, a light emitting element, a photoreceiver, a diode or a transistor can be applied. When each electric element 13 is a light emitting element, a flexible display having flexibility and elasticity can be realized. To the light emitting element, for example, a light emitting diode or organic electroluminescent element having a size of approximately 100 μm such as a mini LED or a micro LED can be applied. When each electric element 13 is an actuator, for example, a piezoelectric element can be applied. It should be noted that each electric element 13 is not limited to the examples shown here. Elements having various other types of functions could be applied. The electric elements 13 may be, for example, capacitors or resistances. The positions or shapes of the electric elements 13 are not limited to the example shown in FIG. 2.

In the present embodiment, the first portions PT1 and second portions PT2 of the insulating base 14, the scanning lines 11, the signal lines 12, the first organic insulating layer 15 and second organic insulating layer 16 described later are collectively called a line portion LP. The island-shaped portions IL of the insulating base 14, the organic insulating layer 19 described later and the electric elements 13 are collectively called island-shaped portions IP. As seen in plan view, the line portion LP includes a plurality of wavy first line portions LP1 extending in the first direction D1 and arranged in the second direction D2, and a plurality of wavy second line portions LP2 extending in the second direction D2 and arranged in the first direction D1. Each island-shaped portion IP is located in the intersection of the first line portion LP1 and the second line portion LP2. The first line portion LP1 includes the first portion PT1 of the insulating base 14 described above and the scanning line 11. The second portion LP2 includes the second portion PT2 of the insulating base 14 and the signal line 12. In the area surrounded by two adjacent first line portions LP1 and two adjacent second line portions LP2, the insulating base 14 is not formed, and an opening OP is formed. In other words, the opening OP may be called the area surrounded by two adjacent first portions PT1 and two adjacent second portions PT2. The openings OP are arranged in matrix in the first direction D1 and the second direction D2.

Figure 3:
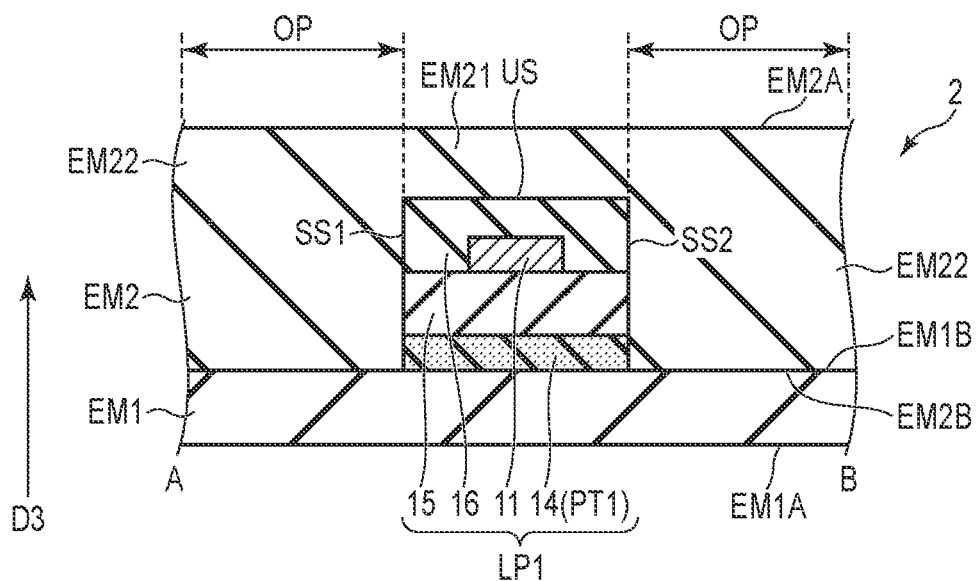
FIG. 3 is a schematic cross-sectional view of part of the flexible substrate along the A-B line shown in FIG. 2.

FIG. 3 is a schematic cross-sectional view of part of the flexible substrate 2 along the A-B line shown in FIG. 2.

In addition to the above elements, the flexible substrate 2 comprises the first organic insulating layer 15, the second organic insulating layer 16, a first elastic member EM1 and a second elastic member EM2.

The first elastic member EM1 comprises an outer surface EM1A, and an inner surface EM1B on the opposite side of the outer surface EM1A. The first line portion LP1 is located on the inner surface EM1B. The first line portion LP1 comprises a first side surface SS1, a second side surface SS2 on the opposite side of the first side surface SS1, and an upper surface US.

The first portion PT1 of the insulating base 14 is located on the inner surface EM1B of the first elastic member EM1. The first organic insulating layer 15 covers the insulating base 14. The scanning line 11 is located on the first organic insulating layer 15. The second organic insulating layer 16 covers the first organic insulating layer 15 and the scanning line 11. Both the first organic insulating layer 15 and the second organic insulating layer 16 are formed of an organic material.

The second elastic member EM2 comprises an outer surface EM2A, and an inner surface EM2B on the opposite side of the outer surface EM2A. The second elastic member EM2 covers the first side surface SS1, second side surface SS2 and upper surface US of the first line portion LP1. In other words, the second elastic member EM2 covers the scanning line 11, the insulating base 14, the first organic insulating layer 15 and the second organic insulating layer 16. Of the first line portion LP1, the second elastic member EM2 is in contact with the insulating base 14, the first organic insulating layer 15 and the second organic insulating layer 16. The inner surface EM2B of the second elastic member EM2 is in contact with the inner surface EM1B of the first elastic member EM1 in the opening OP. The first elastic member EM1, the insulating base 14, the scanning line 11 and the second elastic member EM2 overlap each other in the third direction D3. The insulating base 14 and the scanning line 11 are located between the first elastic member EM1 and the second elastic member EM2.

Of the second elastic member EM2, the portion overlapping the first portions PT1, the second portions PT2 and the island-shaped portions IL is defined as a first portion EM21. The portion located between the first portions PT1 and the second portions PT2, in other words, the portion overlapping the openings OP, is defined as a second portion EM22. The second portion EM22 is in contact with the first elastic member EM1. The first elastic member EM1 and the second elastic member EM2 can be formed of, for example, a transparent resinous material which can expand and contract.

Figure 4:
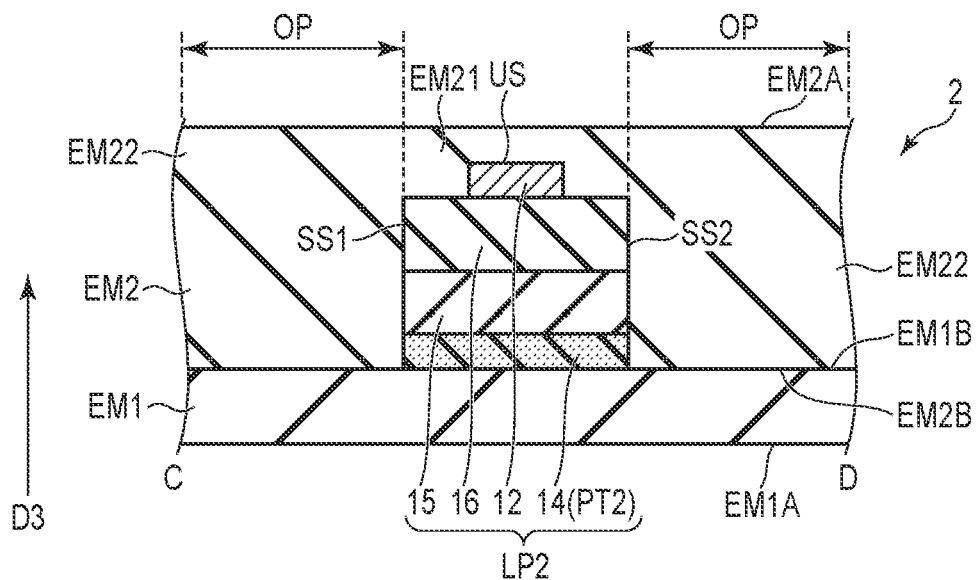
FIG. 4 is a schematic cross-sectional view of part of the flexible substrate along the C-D line shown in FIG. 2.

FIG. 4 is a schematic cross-sectional view of part of the flexible substrate 2 along the C-D line shown in FIG. 2.

The second line portion LP2 is located on the inner surface EM1B of the first elastic member EM1. The second line portion LP2 comprises a first side surface SS1, a second side surface SS2 on the opposite side of the first side surface SS1, and an upper surface US.

The second portion PT2 of the insulating base 14 is located on the inner surface EM1B of the first elastic member EM1. The first organic insulating layer 15 covers the insulating base 14. The second organic insulating layer 16 covers the first organic insulating layer 15. The signal line 12 is located on the second organic insulating layer 16. The second elastic member EM2 covers the first side surface SS1, second side surface SS2 and upper surface US of the second line portion LP2 and is in contact with the inner surface EM1B of the first elastic member EM1 in the opening OP. In other words, the second elastic member EM2 covers the insulating base 14, the first organic insulating layer 15, the second organic insulating layer 16 and the signal line 12 and is in contact with each of them. The first elastic member EM1, the insulating base 14, the signal line 12 and the second elastic member EM2 overlap each other in the third direction D3. The insulating base 14 and the signal line 12 are located between the first elastic member EM1 and the second elastic member EM2.

Figure 5:
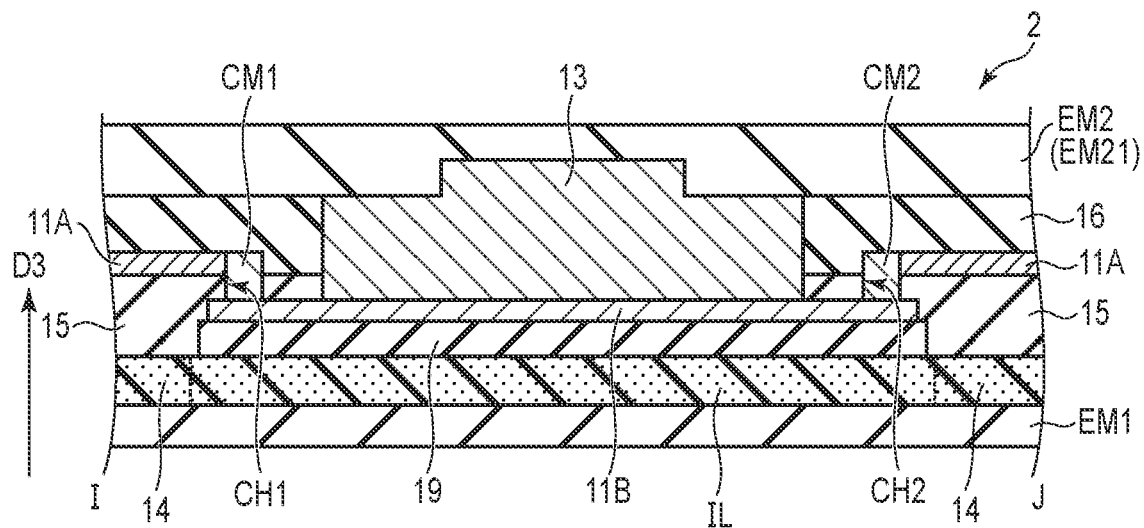
FIG. 5 is a schematic cross-sectional view of part of the flexible substrate along the I-J line shown in FIG. 2.

FIG. 5 is a schematic cross-sectional view of part of the flexible substrate 2 along the I-J line shown in FIG. 2.

The electric element 13 is located on the island-shaped portion IL of the insulating base 14. The inorganic insulating layer 19 (passivation layer) is provided between the electric element 13 and the island-shaped portion IL. The inorganic insulating layer 19 is formed into an island shape overlapping the electric element 13 (or the island-shaped portion IL) as seen in plan view. The first portion 11A is provided on the first organic insulating layer 15 and is covered with the second organic insulating layer 16. The second portion 11B is provided on the inorganic insulating layer 19 and is electrically connected to the electric element 13. In the example shown in FIG. 5, the both end portions of the second portion 11B are covered with the first organic insulating layer 15.

The contact holes CH1 and CH2 are provided in the first organic insulating layer 15. The first portion 11A is electrically connected to the second portion 11B via connection members CM1 and CM2 provided in the contact holes CH1 and CH2. The connection members CM1 CM2 may be part of the first portion 11A or may be provided separately from the first portion 11A.

Thus, the inorganic insulating layer 19 having an island shape is provided between the electric element 13 and the insulating base 14. This inorganic insulating layer 19 functions as a protective film which prevents incursion of liquid, etc., into the electric element 13 and the second portion 11B of the scanning line 11. In this way, the reliability of the flexible substrate 2 is improved. In general, a crack is easily caused in inorganic films compared to organic films. However, since the inorganic insulating layer 19 is not provided under the first portion 11A of the scanning line 11, a break in the first portion 11A is prevented. This explanation is also applied to the signal lines (not shown). Further, compared to a case where the inorganic insulating layer 19 is provided in the entire flexible substrate 2, the elasticity or flexibility of the flexible substrate 2 is difficult to degrade.

In addition, in the scanning line 11, the second portion 11B overlapping the electric element 13 is provided in a layer different from the first portion 11A. Thus, the degree of freedom of designing near the electric element 13 is improved. As the contact holes CH1 and CH2 are provided above the inorganic insulating layer 19, a connection defect in the connection position of the first portion 11A and the second portion 11B is prevented. Moreover, the island-shaped portion IL of the insulating base 14 is provided under the electric element 13. By this structure, the electric element 13 can be satisfactorily supported.

The island-shaped portion IL is located on the inner surface EM1B of the first elastic member EM1. The second elastic member EM2 covers the electric element 13. The first elastic member EM1, the island-shaped portion IL, the electric element 13 and the second elastic member EM2 overlap each other in the third direction D3.

Now, this specification explains a method of controlling the line strain (compressive strain) when the first portion PT1 is compressed. Here, the line strain was calculated by preparing the three samples (sample 1, sample 2 and sample 3) explained below and conducting a compressive test for each sample.

Figure 6:
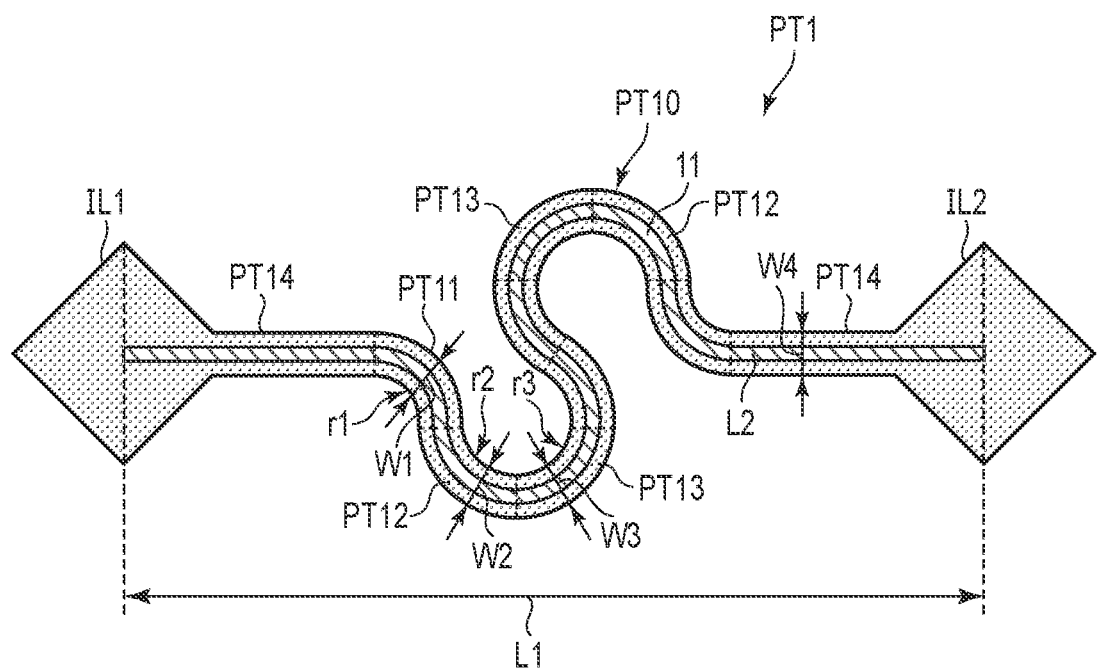
FIG. 6 is a diagram for explaining an example of the structure applied to a first portion.

FIG. 6 is a diagram for explaining the structure of sample 1. The structure of sample 1 shown in FIG. 6 is a structure called a basic structure. A band-like portion PT10 connecting island-shaped portion IL1 and island-shaped portion IL2 meanders in an S-shape. The scanning line 11 is formed over island-shaped portion IL1, the band-like portion PT10 and island-shaped portion IL2. The scanning line 11 formed in the band-like portion PT10 meanders based on the shape of the band-like portion PT10. The band-like portion PT10 comprises curved portions PT11 to PT13 forming the portion which meanders in an S-shape, and straight line portions PT14 connecting the portion which meanders in an S-shape and island-shaped portions IL1 and IL2. Curved portion PT11 is connected to the straight line portion PT14 and is curved so as to move away from the straight line portion PT14 in both the extension direction of the straight line portion PT14 and a direction orthogonal to the extension direction of the straight line portion TP14. Curved portion PT12 is connected to curved portion PT11 and is curved so as to move away from the straight line portion PT14 in both the extension direction of the straight line portion PT14 and a direction orthogonal to the extension direction of the straight line portion TP14. Curved portion PT13 is connected to curved portion PT12, and is curved so as to move away from the straight line portion PT14 in the extension direction of the straight line portion PT14, and is curved so as to approach the straight line portion PT14 in a direction orthogonal to the extension direction of the straight line portion PT14.

The radii of curvature along the inner circumferences of curved portions PT11 to PT13 are defined as r1 to r3, respectively. In the structure of sample 1 shown in FIG. 6, radii of curvature r1 to r3 show the same value. The line widths of curved portions PT11 to PT13 (more specifically, the distances between the middle points of the inner circumferences of curved portions PT11 to PT13 and the middle points of the outer circumferences) and the line width of the straight line portion PT14 are defined as W1 to W4, respectively. In the structure of sample 1 shown in FIG. 6, line widths W1 to W4 show the same value. The linear distance from an end of the scanning line 11 located in island-shaped portion IL1 to the other end of the scanning line 11 located in island-shaped portion IL2 (or the pitch of island-shaped portions IL1 and IL2) is defined as L1. The entire length of the scanning line 11 over island-shaped portion IL1, the band-like portion PT10 and island-shaped portion IL2 is defined as L2. The hinge length ratio L' is defined by L2/L1.

The results of the compressive tests (line strain) are described later. Here, the following matter is confirmed. When a compressive stress is applied in a direction in which island-shaped portions IL1 and IL2 of sample 1 approach each other, the strongest compressive stress is applied to the portions shown by hatch lines in FIG. 7, in other words, to the outer circumferential portions of curved portions PT12 which slightly shift from the boundary portions between curved portions PT12 and curved portions PT13 to the curved portion PT12 sides. In other words, when the first portion PT1 (band-like portion PT10) is broken because of the application of a compressive stress, the possibility that the portions shown by the hatch lines in FIG. 7 are broken is the highest. In the explanation below, the portions shown by the hatch lines in FIG. 7 may be also called stress concentration portions.

FIG. 8 is a diagram for explaining the structure of sample 2. Here, only portions different from the basic structure shown in FIG. 6 are explained, and the explanation of the same portion is omitted.

The structure of sample 2 shown in FIG. 8 is different from the basic structure shown in FIG. 6 in respect that line width W of the band-like portion PT10 gradually decreases (narrows) from the center O of the portion which meanders in an S-shape to curved portion PT12. In other words, line width W2 of curved portion PT12 is less than line width W3 of curved portion PT13. In the structure of sample 2 shown in FIG. 8, line width W1 of curved portion PT11 and line width W4 of the straight line portion PT14 show the same value. Line width W1 of curved portion PT11 and line width W4 of the straight line portion PT14 are less than line width W2 of curved portion PT12 and show the same value as the line width of the boundary portion between curved portions PT11 and PT12. In the structure of sample 2 shown in FIG. 8, radii of curvature r1 to r3 show the same value.

Figures 9, 10:
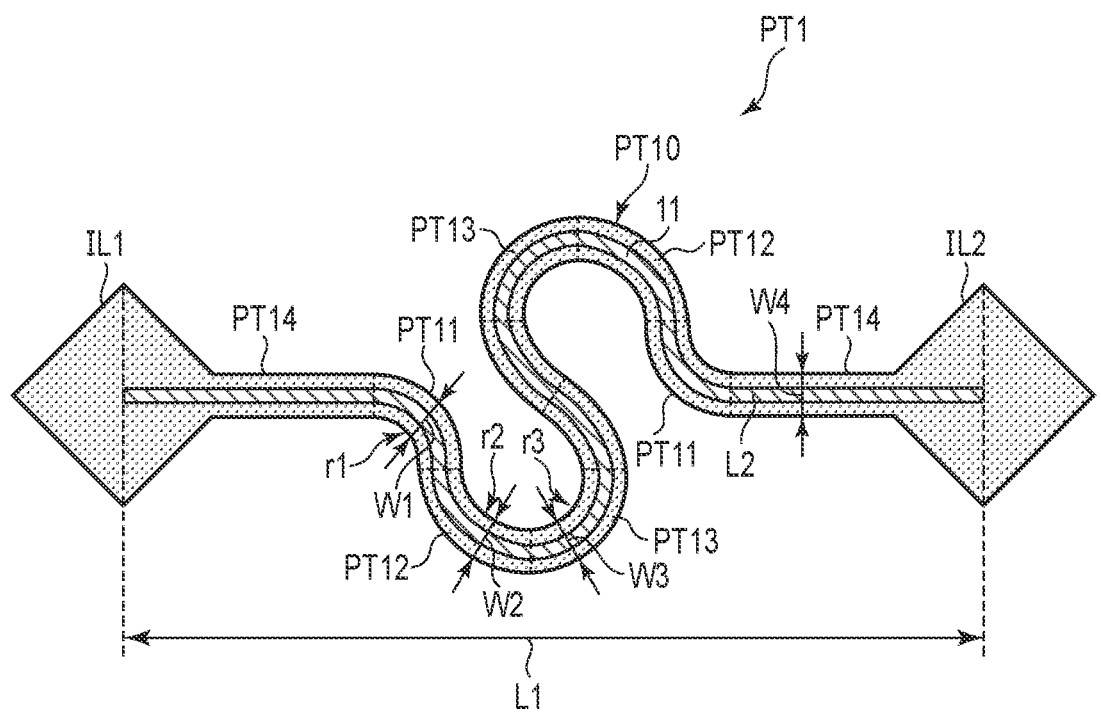
FIG. 9 is a diagram for explaining yet another example of the structure applied to the first portion.
FIG. 10 is a diagram for explaining examples of conditions of samples.

FIG. 9 is a diagram for explaining the structure of sample 3. Here, only portions different from the basic structure shown in FIG. 6 are explained, and the explanation of the same portion is omitted.

The structure of sample 3 shown in FIG. 9 is different from the basic structure shown in FIG. 6 in respect that radius of curvature r2 of curved portion PT12 is greater than radius of curvature r3 of curved portion PT13. In the structure of sample 3 shown in FIG. 9, radius of curvature r1 of curved portion PT11 shows the same value as radius of curvature r3 of curved portion PT13. In the structure of sample 3 shown in FIG. 9, line widths W1 to W4 show the same value.

FIG. 10 is a diagram for explaining the examples of conditions (specific values) of radius of curvature r2 and line width W2 of sample 1, sample 2 and sample 3.

Radius of curvature r2 of curved portion PT12 of sample 1 shown in FIG. 6 is 15 μm, and line width W2 of curved portion PT12 is 30 μm.

Radius of curvature r2 of curved portion PT12 of sample 2 shown in FIG. 8 is 15 μm, and line width W2 of curved portion PT12 is 10 μm.

Radius of curvature r2 of curved portion PT12 of sample 3 shown in FIG. 9 is 45 μm, and line width W2 of curved portion PT12 is 30 μm.

FIG. 11 is a diagram showing the result of the compressive test of each sample. In the compressive tests, the line strain of the first portion PT1 (the line strain of the band-like portion PT10) was calculated when a compressive stress in which the compression rate was 10% was applied in a direction in which island-shaped portions IL1 and IL2 of each sample approach each other. The compression rate is one of the indices showing the magnitude of the compressive stress, and is calculated by, for example, dividing the difference (compression amount) between linear distance L1 before the application of the compressive stress and linear distance L1' after the application of the compressive stress by linear distance L1 and subsequently multiplying it by 100. Here, the compressive tests assume a case where the compression rate is 10% as described above. Thus, a compressive stress to the extent that linear distance L1 is shortened to 0.9*L1 (=L1') was applied in a direction in which island-shaped portion IL1 and IL2 of each sample approach each other. The line strain of the first portion PT1 shows the degree of strain of the first portion PT1 when a compressive stress is applied to the first portion PT1 such that a state in which no compressive stress is applied to the first portion PT1 is a state without line strain (line strain 0%). It is confirmed that, as the line strain is increased, the possibility that a break occurs when a compressive stress is applied is increased.

As shown in FIG. 11, as a result of the above compressive rests, the line strain of sample 1 was 20%. The line strain of sample 2 was 5%. The line strain of sample 3 was 10%. According to the compressive tests, the following matters were confirmed. In the basic structure of sample 1, the line strain is the greatest, and the possibility of a break when a compressive stress is applied is high. In the structures of sample 2 and sample 3, compared to the basic structure, the line strain is less, and a break is difficult to occur even if a compressive stress is applied.

More specifically, the following matters were confirmed. By making line width W2 of curved portion PT12 including a stress concentration portion less than line width W3 of curved portion PT13 like the structure of sample 2, the line strain is decreased, and a structure in which a break is difficult to occur even if a compressive stress is applied can be realized.

Further, the following matters were confirmed. By making radius of curvature r2 of curved portion PT12 including a stress concentration portion greater than radius of curvature r3 of curved portion PT13 like the structure of sample 3, the line strain is decreased, and a structure in which a break is difficult to occur even if a compressive stress is applied can be realized.

The above results show that the line strain of the first portion PT1 can be controlled by radius of curvature r2 and line width W2 of curved portion PT12 including a stress concentration portion. Here, a method of controlling the line strain of the first portion PT1 is explained. However, the line strain of the second portion PT2 can be also controlled by the same method.

As explained above, the present embodiment can provide an electronic device comprising lines which are difficult to break when a compressive stress is applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
an insulating base having elasticity;
a plurality of lines provided on the insulating base; and
a plurality of electric elements connected to the lines, wherein
the insulating base comprises a plurality of island-shaped portions in which the electric elements are located, and
a plurality of band-like portions in which the lines are provided and which connect the adjacent island-shaped portions,
each of the band-like portions includes a curved portion which meanders, and a straight line portion which connects the curved portion and the island-shaped portion,
the curved portion includes a first curved portion, a second curved portion and a third curved portion,
the first curved portion is connected to the straight line portion and is curved so as to move away from the straight line portion in both a first direction in which the straight line portion extends and a second direction orthogonal to the first direction,
the second curved portion is connected to the first curved portion and is curved so as to move away from the straight line portion in both of the directions,
the third curved portion is connected to the second curved portion and is curved so as to move away from the straight line portion in the first direction and so as to approach the straight line portion in the second direction, and
a width of the second curved portion is less than a width of the third curved portion.

2. The electronic device of claim 1, wherein
a width of the first curved portion is less than the width of the second curved portion, and
a width of the straight line portion is equal to the width of the first curved portion.

3. The electronic device of claim 1, wherein
a radius of curvature of the first curved portion, a radius of curvature of the second curved portion and a radius of curvature of the third curved portion are equal.

4. An electronic device comprising:
an insulating base having elasticity;
a plurality of lines provided on the insulating base; and
a plurality of electric elements connected to the lines, wherein
the insulating base comprises a plurality of island-shaped portions in which the electric elements are located, and
a plurality of band-like portions in which the lines are located and which connect the adjacent island-shaped portions,
each of the band-like portions includes a curved portion which meanders, and a straight line portion which connects the curved portion and the island-shaped portion,
the curved portion includes a first curved portion, a second curved portion and a third curved portion,
the first curved portion is connected to the straight line portion and is curved so as to move away from the straight line portion in both a first direction in which the straight line portion extends and a second direction orthogonal to the first direction,
the second curved portion is connected to the first curved portion and is curved so as to move away from the straight line portion in both of the directions,
the third curved portion is connected to the second curved portion and is curved so as to move away from the straight line portion in the first direction and so as to approach the straight line portion in the second direction, and
a radius of curvature of the second curved portion is greater than a radius of curvature of the third curved portion.

5. The electronic device of claim 4, wherein
a radius of curvature of the first curved portion is equal to the radius of curvature of the third curved portion.

6. The electronic device of claim 4, wherein
the first curved portion, the second curved portion, the third curved portion and the straight line portion have a same width.
7. The electronic device of claim 1, wherein
the insulating base is formed into a mesh shape.
8. The electronic device of claim 1, wherein
each of the electric elements is a light emitting element or a sensor.

* * * * *